(12) United States Patent
Epler et al.

(10) Patent No.: US 8,053,905 B2
(45) Date of Patent: *Nov. 8, 2011

(54) COMPLIANT BONDING STRUCTURES FOR SEMICONDUCTOR DEVICES

(75) Inventors: John E. Epler, San Jose, CA (US); Michael R. Krames, Los Altos, CA (US); James G. Neff, Felton, CA (US); Stefano Schiaffino, Pleasanton, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/897,866

(22) Filed: Oct. 5, 2010

(65) Prior Publication Data

US 2011/0114987 A1    May 19, 2011

Related U.S. Application Data

(63) Continuation of application No. 12/397,392, filed on Mar. 4, 2009, now Pat. No. 7,875,984.

(51) Int. Cl.
*H01L 23/48* (2006.01)
(52) U.S. Cl. . 257/778; 257/780; 257/782; 257/E23.003; 438/108
(58) Field of Classification Search .............. 257/778, 257/780, 782, E23.003; 438/108
See application file for complete search history.

(56) References Cited

U.S. PATENT DOCUMENTS

| 6,455,878 | B1 | 9/2002 | Bhat et al. |
|---|---|---|---|
| 7,875,984 | B2 * | 1/2011 | Epler et al. ............ 257/778 |
| 2002/0145205 | A1 | 10/2002 | Hirano et al. |
| 2002/0179921 | A1 | 12/2002 | Cohn |
| 2002/0190260 | A1 | 12/2002 | Shen et al. |
| 2004/0188696 | A1 | 9/2004 | Hsing Chen et al. |
| 2006/0202223 | A1 | 9/2006 | Sackrison et al. |
| 2007/0023777 | A1 | 2/2007 | Sonobe et al. |
| 2007/0072324 | A1 | 3/2007 | Krames et al. |
| 2007/0096130 | A1 | 5/2007 | Schiaffino et al. |
| 2007/0181889 | A1 | 8/2007 | Orita |
| 2008/0054290 | A1 | 3/2008 | Shieh et al. |

FOREIGN PATENT DOCUMENTS

| JP | 11251645 A | 7/1999 |
|---|---|---|
| JP | 10046978 | 9/1999 |

OTHER PUBLICATIONS

Joachim Kloeser et al, "High-Preformance FLICP Chip Packages With Copper Pillar Bumping", www.globalsmt.net, Global SMT & Packaging, May 2006, p. 28-31.

* cited by examiner

*Primary Examiner* — Trung Q Dang

(57) ABSTRACT

A light emitting device includes a semiconductor structure comprising a light emitting layer disposed between an n-type region and a p-type region, a metal p-contact disposed on the p-type region, and a metal n-contact disposed on the n-type region. The metal p-contact and the metal n-contact are both formed on the same side of the semiconductor structure. The light emitting device is connected to a mount by a bonding structure. The bonding structure includes a plurality of metal regions separated by gaps and a metal structure disposed between the light emitting device and the mount proximate to an edge of the light emitting device. The metal structure is configured such that during bonding, the metal structure forms a continuous seal between the light emitting device and the mount.

19 Claims, 6 Drawing Sheets

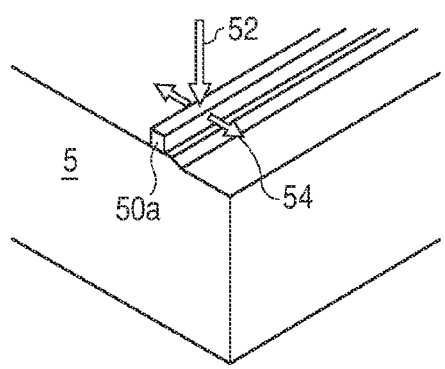
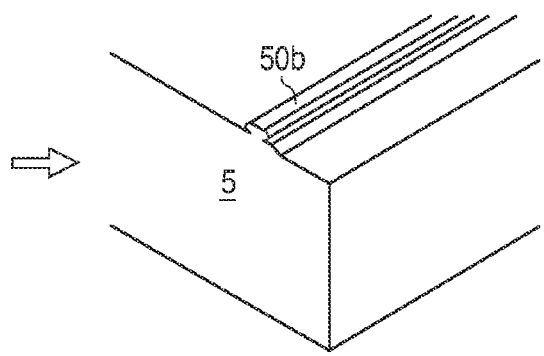
FIG. 8  FIG. 9
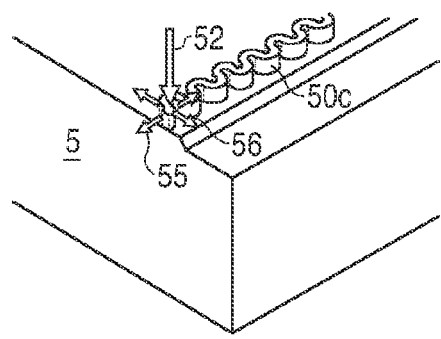
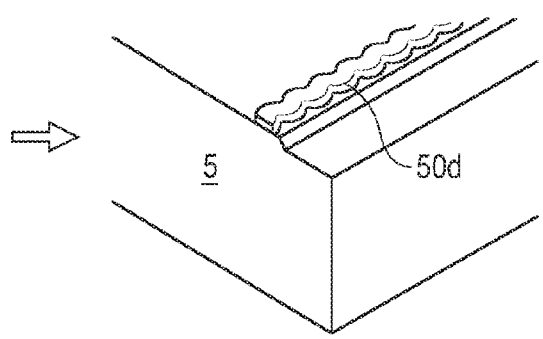
FIG. 10  FIG. 11
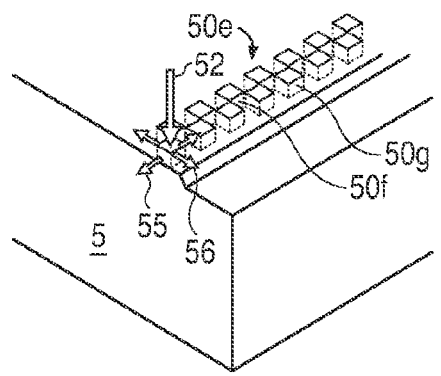
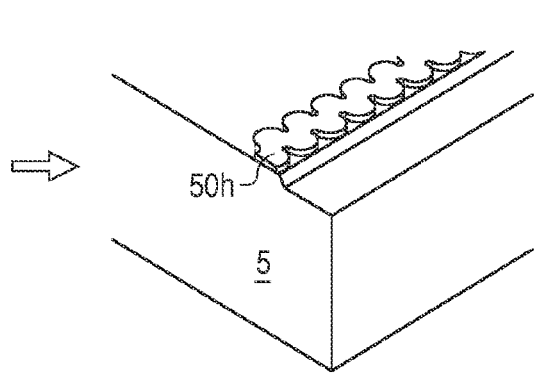
FIG. 12  FIG. 13

COMPLIANT BONDING STRUCTURES FOR SEMICONDUCTOR DEVICES

CROSS-REFERENCE TO RELATED APPLICATIONS

The present application is a continuation of U.S. application Ser. No. 12/397,392, filed Mar. 4, 2009 now U.S. Pat. No. 7,875,984, titled "Compliant Bonding Structures For Semiconductor Devices", and incorporated herein by reference.

FIELD OF INVENTION

The invention relates to the field of bonding semiconductor devices to other structures, and more specifically to compliant bonding structures for mounting semiconductor light emitting devices on other structures.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

US Patent Application 2007-0096130 describes "a process for forming an LED structure using a laser lift-off process to remove the growth substrate (e.g., sapphire) after the LED die is bonded to a submount. To obviate the need to use an underfill between the submount and the LED die to support the die, the underside of the LED die has formed on it anode and cathode electrodes that are substantially in the same plane, where the electrodes cover at least 85% of the back surface of the LED structure. The submount has a corresponding layout of anode and cathode electrodes substantially in the same plane.

"The LED die electrodes and submount electrodes are interconnected together such that virtually the entire surface of the LED die is supported by the electrodes and submount. No underfill is used. Different methods for LED to submount interconnection can be used, such as ultrasonic or thermosonic metal-to-metal interdiffusion (Gold-Gold, Copper-Copper, other ductile metals, or a combination of the above), or soldering with different alloy compositions such as Gold-Tin, Gold-Germanium, Tin-Silver, Tin-Lead, or other similar alloy systems.

"The growth substrate, forming the top of the LED structure, is then removed from the LED layers using a laser lift-off process, which ablates the material at the interface of the growth substrate and the LED layers. The extremely high pressures created during the laser lift-off process do not damage the LED layers due to the large area support of the LED layers by the electrodes and submount. Other substrate removal processes can also be used.

SUMMARY

An object of the invention is to provide an electrical, mechanical, and thermal connection between a semiconductor light emitting device and a structure on which the semiconductor light emitting device is mounted.

In accordance with embodiments of the invention, a light emitting device includes a semiconductor structure comprising a light emitting layer disposed between an n-type region and a p-type region, a metal p-contact disposed on the p-type region, and a metal n-contact disposed on the n-type region. The metal p-contact and the metal n-contact are both formed on the same side of the semiconductor structure. The light emitting device is connected to a mount by a bonding structure. The bonding structure includes a plurality of metal regions separated by gaps and a metal structure disposed between the light emitting device and the mount proximate to an edge of the light emitting device. The metal structure is configured such that during bonding, the metal structure forms a continuous seal between the light emitting device and the mount.

In accordance with embodiments of the invention, a method of bonding a light emitting device to a mount is provided. The light emitting device includes a semiconductor structure comprising a light emitting layer disposed between an n-type region and a p-type region, a metal p-contact disposed on the p-type region, and a metal n-contact disposed on the n-type region. The metal p-contact and the metal n-contact are both formed on the same side of the semiconductor structure. The method includes positioning a bonding structure between the light emitting device and the mount. The bonding structure includes a first metal structure disposed between the mount and one of the metal n-contact and the metal p-contact and a second metal structure disposed between the light emitting device and the mount proximate to an edge of the light emitting device. The method further includes causing the first and second metal structures to collapse. The second metal structure forms a continuous seal between the light emitting device and the mount.

BRIEF DESCRIPTION OF THE DRAWINGS

FIG. 8 illustrates a continuous, linear edge seal.

FIG. 9 illustrates the edge seal of FIG. 8 after undergoing plastic deformation during bonding.

FIG. 10 illustrates a continuous non-linear edge seal.

FIG. 11 illustrates the edge seal of FIG. 10 after undergoing plastic deformation during bonding.

FIG. 12 illustrates a non-continuous edge seal.

FIG. 13 illustrates the edge seal of FIG. 12 after undergoing plastic deformation during bonding.

DETAILED DESCRIPTION

In devices with large-area metal contacts, as described above in US Patent Application 2007-0096130, large bonding pressure and ultrasonic power may be necessary during bonding, to overcome slight variations in the topography of the LED die electrodes and the submount electrodes. Aggressive bonding conditions can cause damage to the semiconductor material in the LED during bonding. Aggressive bonding conditions may be necessitated by the lack of compliance (i.e. deformation and collapse) in the electrodes during bonding, due to the large area of the electrodes.

In some embodiments of the invention, a compliant bonding structure is disposed between an LED die and a mount. The compliant bonding structure may be disposed on the LED die, on the mount, or on both the LED die and the mount. During bonding, the compliant structure collapses and reflows, resulting in a robust electrical, thermal, and mechanical connection that may not require aggressive bonding conditions and that may compensate for slight variations in the topography of the LED die and the mount.

FIGS. 1-4 illustrate how to form a compliant bonding structure according to embodiments of the invention.

Figure 1:
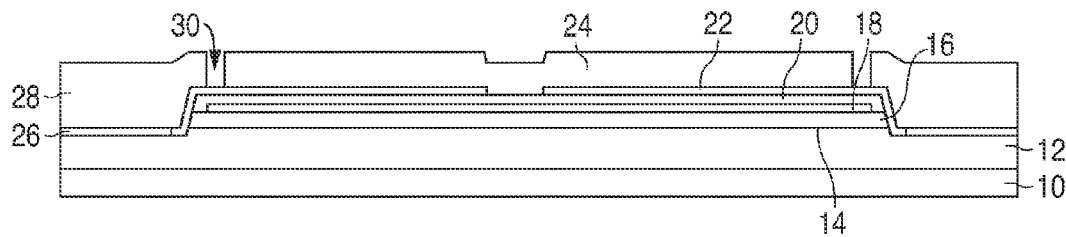
FIG. 1 is a cross section of a III-nitride device grown on a substrate.

FIG. 1 illustrates a III-nitride device grown on a substrate 10. Substrate 10 may be any suitable growth substrate, including, for example, sapphire, SiC, GaN, or engineered substrates such as SiC attached to an insulator, or III-nitride materials attached to an insulator. Engineered substrates suitable for growth of III-nitride devices are described in more detail in US Published Application 2007-0072324, which is incorporated herein by reference.

An n-type region 12 is grown first over substrate 10. N-type region 12 may include multiple layers of different compositions and dopant concentration including, for example, preparation layers such as buffer layers or nucleation layers, which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light.

A light emitting or active region 14 is grown over n-type region 12. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region 16 is grown over light emitting region 14. Like the n-type region, the p-type region may include multiple layers of different composition, thickness, and dopant concentration, including layers that are not intentionally doped, or n-type layers.

In some embodiments, substrate 10 is about 90 microns thick, and the device layers 12, 14, and 16 have a combined thickness less than 5 microns.

After growth of semiconductor regions 12, 14, and 16, one or more portions of p-type region 16 and light emitting region 14 are etched away to reveal portions of n-type region 12. An n-contact 26 is formed on the exposed portions of n-type region 12.

A multi-layer p-contact is formed over p-type region 16. In the example shown in FIG. 1, an ohmic contact layer 18 is formed in direct contact with p-type region 16, then a guard layer 20, which may be metal or dielectric, is formed over ohmic contact layer 18. As illustrated in FIG. 1, guard layer 20 may extend over the sides of ohmic contact layer 18. For example, ohmic contact layer 18 may include silver, which is subject to electromigration which can cause shorting or reliability problems. Guard layer 20, formed over ohmic contact layer 18, may prevent or reduce electromigration of ohmic contact layer 18. In some embodiments, more p-contact layers may be used, or guard layer 20 may be omitted.

A dielectric layer 22 may isolate n-contact 26 from the p-contact 18, 20.

A p-bond pad 24 is formed over and electrically connected to the p-contact. An n-bond pad 28 is formed over and electrically connected to the n-contact. Bond pads 24 and 28 support the device layers 12, 14, and 16 during removal of growth substrate 10, and conduct heat away from the device layers. Bond pads 24 and 28 may be formed from any metal with high thermal conductivity, such as, for example, gold, copper, or aluminum. Bond pads may be, for example, electroplated to a thickness between 6 and 30 microns in some embodiments, between 15 and 25 microns in some embodiments. Air gaps 30 may electrically isolate n- and p-bond pads 28 and 24, as illustrated in FIG. 1. The gaps are preferably less than 50 microns wide. As described above, bond pads 24 and 28 provide heat transfer and support the semiconductor layers during removal of growth substrate 10. In devices that do not require the heat transfer provided by bond pads 24 and 28 and that do not require support of the semiconductor layers (i.e., in devices where the growth substrate is not removed from the device), bond pads 24 and 28 may be omitted, and microbumps 32 may be formed directly on the p- and n-contacts.

N- and p-bond pads 28 and 24 cover at least 60% of the area of the LED (i.e., the area of semiconductor material on the LED) in some embodiments, at least 85% of the area of the LED in some embodiments.

Details of steps that may be conventional or well known in the art of forming III-N LEDs do not need to be described, and there may be many ways of forming the same structure shown in the figures. Such details that may be conventional or well known include cleaning, deposition techniques (e.g., sputtering, CVD, electro-plating, etc.), lithographic techniques, masking techniques, etching techniques, metal lift-off techniques, photoresist stripping techniques, and separating dice from a wafer.

Figure 2:
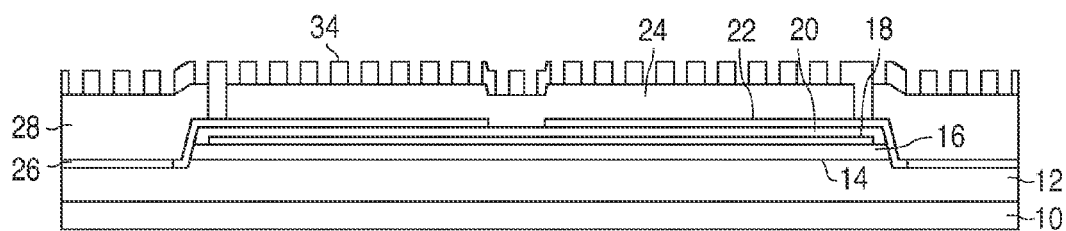
FIG. 2 is a cross section of the device of FIG. 1 after depositing and patterning a photoresist layer.

In FIG. 2, a photoresist layer 34 is formed over the top of p-bond pad 24 and n-bond pad 28, then patterned to form a series of small openings.

Figure 3:
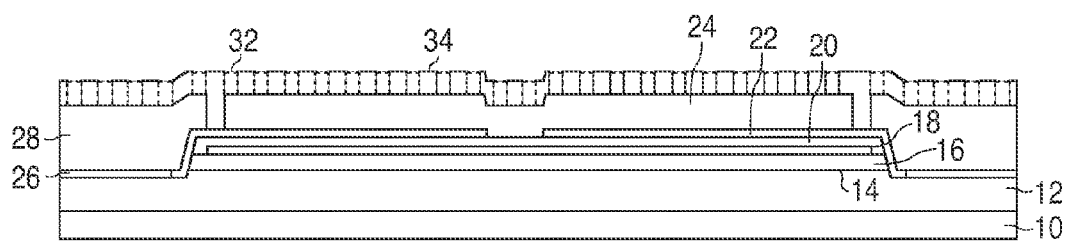
FIG. 3 is a cross section of the device of FIG. 2 after depositing metal in the openings in the photoresist layer.

In FIG. 3, a compliant metal 32 is electroplated in the openings in photoresist layer 34. Any suitable metal, for example with a Young's modulus less than 150 GPa, may be used. Examples of suitable metals include gold, with a Young's modulus of about 78 GPa, copper, with a Young's modulus between about 110 and 128 GPa, and aluminum, with a Young's modulus of about 70 GPa.

Figure 4:
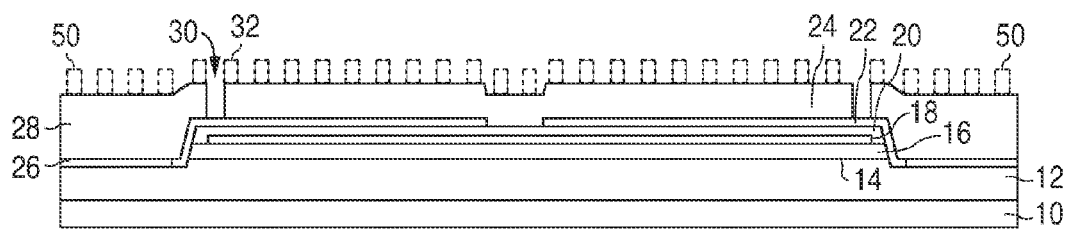
FIG. 4 is a cross section of the device of FIG. 3 after stripping the photoresist layer.

In FIG. 4, the photoresist layer 34 is stripped, leaving compliant metal microbumps 32. Microbumps 32 may be, for example, between 6 and 25 microns in lateral extent. They may have a circular cross section, though any cross section that can be patterned in photoresist layer 34 may be used. Microbumps may be between 6 and 25 microns tall, and spaced between 6 and 25 microns apart. Microbumps may have approximately the same height and width. In some embodiments, the size, height, and spacing of microbumps 32 are determined by the thickness of photoresist layer 34. The spaces in photoresist layer 34 in which microbumps 32 are plated can be made about as wide and spaced about as far apart as the photoresist layer is thick. For example, if a 10 micron thick photoresist layer is used, the smallest microbumps patterned may be about 10 microns wide and spaced about 10 microns apart. In some embodiments, the size, height, and spacing of microbumps 32 are unrelated to the thickness of photoresist layer 34. The microbumps can be made thicker than photoresist layer 34, though mushroom heads will form above the photoresist layer. The size and spacing of microbumps 32 are selected such that when the LED die is attached to a mount, the microbumps deform such most or all of the area between the LED die and the mount is filled with microbump material, leaving very small or no gaps between the LED die and the mount. For example, after attaching the LED die to a mount, in an area where the microbumps are formed (for example, the area of n- and p-bond pads in some embodiments) the space between the LED die and the mount is at least 50% filled with deformed microbumps in some embodiments, at least 75% filled with deformed microbumps in some embodiments, and at least 85% filled with deformed microbumps in some embodiments. The gaps between adjacent microbumps after bonding may be less than 5 microns in some embodiments, less than 2 microns in some embodiments, and less than 1 micron in some embodiments. The height of microbumps after bonding may be less than 50% the original height in some embodiments, less than 20% the original height in some embodiments, and less than 10% of the original height in some embodiments.

After the processing illustrated in FIG. 4, a wafer of devices may be diced.

Figure 5:
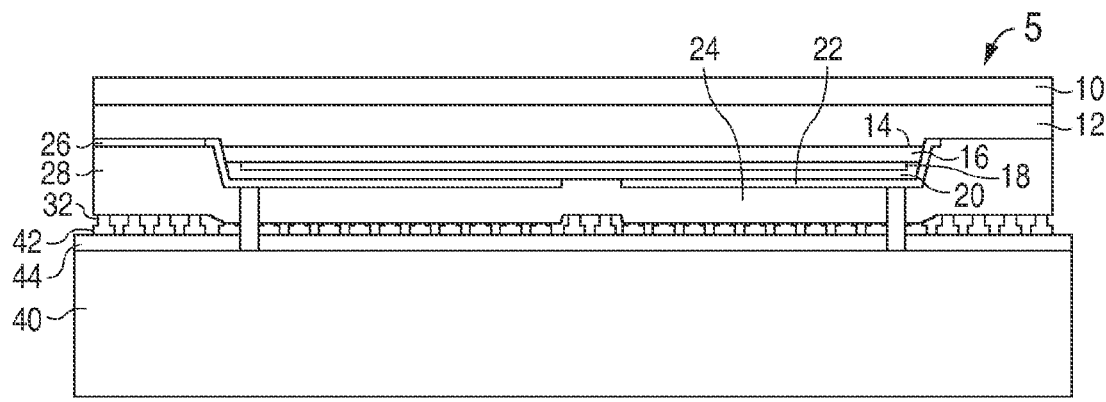
FIG. 5 is a cross section of the structure of FIG. 4 connected to a mount.

In FIG. 5, the device illustrated in FIG. 4 is flipped and mounted on a mount 40. Microbumps 42 may be formed on mount 40 to align with microbumps 32 formed on LED die 5. Microbumps may be formed on only one of LED die 5 and mount 40, or on both. LED die 5 is connected to mount 40 by applying pressure between LED die 5 and mount 40. Pressure may be accompanied by ultrasonic energy, heat, or both. The addition of one or both of ultrasonic energy and heat may reduce the pressure necessary to form a bond. Microbumps 42 formed on the mount and/or microbumps 32 formed on the LED die undergo plastic deformation (i.e., they do not return to their original shape) during bonding and form a continuous or nearly continuous metal support between the LED die and mount 40. For example, in some embodiments, after bonding, microbumps fill nearly all the space between the LED die and mount 40 corresponding to an area of n- and p-bond pads 28 and 24.

During ultrasonic bonding, LED die 5 is positioned on mount 40. A bond head is positioned on the top surface of LED die 5, often the top surface of sapphire growth substrate 10 in the case of a III-nitride device grown on sapphire. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and LED die 5 to vibrate, often at an amplitude on the order of microns. The vibration causes atoms in the metal lattice of microbumps 32 and 42 to interdiffuse, resulting in a metallurgically continuous joint. Heat and/or pressure may be added during bonding. During ultrasonic bonding, compliant bonding structures such as microbumps 32 and 42 collapse and reflow.

In some embodiments, the characteristics or arrangement of microbumps located at different parts of the device may have different properties. For example, microbumps may be larger and/or spaced more closely together in areas of the device that need more support during substrate removal. For example, in the areas near where the mesas are etched to expose the n-type region, the remaining p-type material may be thinned slightly, due to the mesa etch. In these areas, microbumps may be larger and/or more closely spaced, to provide more support to the thinner semiconductor material.

Microbumps 32 may be formed by other techniques, such as, for example, using a photoresist mask and a metal lift-off method, or by mechanically patterning a deposited or plated large-area, thick bonding pad. Mechanical patterning techniques include, for example, stamping, laser machining, chemical or dry etching, or mechanical roughening. In some embodiments, multiple, stacked layers of microbumps which are offset from each other may be used. Multiple layers of microbumps may result in bonding compliance in both lateral and vertical directions.

Figure 6:
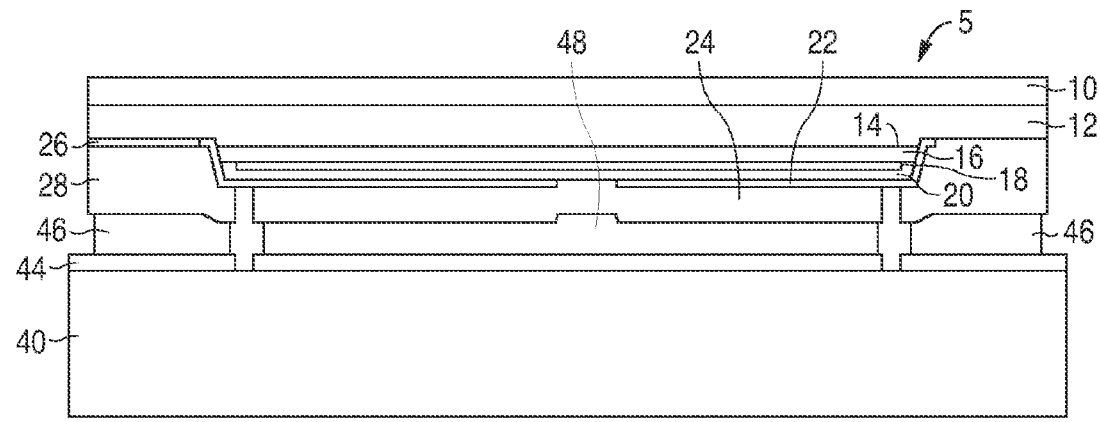
FIG. 6 is a cross section of a III-nitride device connected to a mount.

In some embodiments, microbumps 32 and 42 are replaced with a different compliant, electrically, and thermally conductive structure. FIG. 6 illustrates an example of an alternate embodiment. Instead of microbumps, a porous metal structure 46 is disposed between LED die 5 and mount 40. Porous metal structure 46 may be formed on bond pads 24 and 28 of LED die 5, on bond pads 44 of mount 40, or on both the LED bond pads and the mount bond pads. Porous metal structure 46 may be formed by, for example, plating a soft metal under process conditions that made the plated surface porous, rough, or dendritic in nature, or by sintering small particles of metal to make a fused porous structure. LED die 5 and mount 40 may then be bonded as described above. Porous metal structure 46 may undergo plastic deformation during bonding. Unlike solder, which becomes liquid during bonding, compliant bonding structures such as the microbumps and porous metal structures described herein generally collapse in the solid phase. Though heat may be applied during bonding which may cause the compliant bonding structure to become softer or to begin to melt, in some embodiments the compliant bonding structure does not get hot enough to become completely liquid phase.

A compliant structure such as microbumps or a porous metal structure may compensate for slight surface non-planarities between the bond pads on the LED die and the surface of the mount on which the LED die is mounted, without requiring high pressure or temperature during bonding. The ability of microbumps to deform may reduce the pressure and/or temperature required to form a bond with robust thermal, mechanical, and electrical connections, and may reduce the occurrence of cracking or other damage during bonding to the mount.

After bonding LED die 5 to mount 40, growth substrate 10 may be removed, for example by laser lift off, etching, or any other technique suitable to a particular growth substrate. After removing the growth substrate, the semiconductor structure may be thinned, for example by photoelectrochemical etching, and/or the surface may be roughened or patterned, for example with a photonic crystal structure. A lens, wavelength converting material, or other structure known in the art may be disposed over LED 5 after substrate removal.

In some embodiments, the microbumps along the edge of LED die 5 are configured to form a seal during bonding. In the device illustrated in FIG. 4, microbumps 50 on the edge of the device are configured to form a seal. The seal may provide extra mechanical support to the edge of the device and may prevent foreign material such as humidity or silicone encapsulants from entering any spaces between LED die 5 and mount 40.

Figure 7:
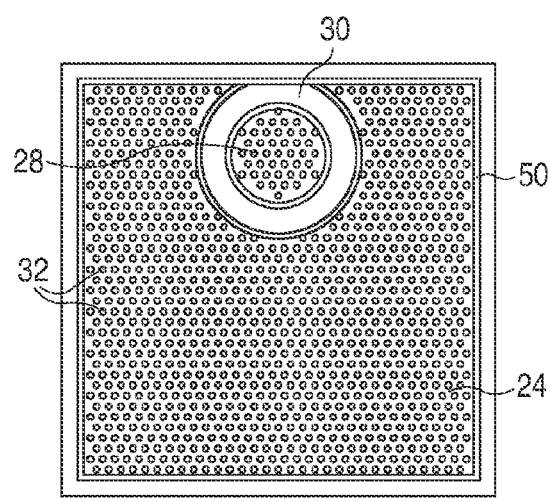
FIG. 7 is a plan view of an LED device with microbumps and an edge seal.

FIG. 7 is a plan view of a device with a first example of an edge seal. In the device illustrated in FIG. 7, a continuous, linear bump seal 50 surrounds microbumps 32. For example, an edge seal surrounds the microbumps in p-bond pad area 24 at the edge of die 5 and surrounds a gap 30 between the p-bond pad and the n-bond pad. Another seal surrounds the microbumps formed on the n-bond pad area 28. FIG. 8 illustrates a portion of a device with a linear perimeter bump seal 50a as illustrated in FIG. 7. Only a portion of linear bump seal 50a is shown, and microbumps 32 are omitted for clarity. When pressure 52 is applied to bump seal 50a, such as while bonding device 5 to a mount (not shown in FIG. 8), bump seal 50a can deform in only one direction, indicated by arrows 54. FIG. 9 illustrates the edge seal of FIG. 8 after undergoing plastic deformation during bonding. Edge seal 50b has spread out in the direction 54 indicated in FIG. 8.

Since the continuous linear edge seal 50a illustrated in FIGS. 7 and 8 can only deform in one direction, it is less compliant than microbumps 32, which can deform in more than one direction. As a result, during bonding, more force may be exerted on the portion of the LED device underlying edge seal 50a than is exerted on the portion of the LED device underlying microbumps 32.

In some embodiments, an edge seal 50 is configured to deform in more than one direction during bonding. In some embodiments, the shape of edge seal 50 is selected such that the compliance of edge seal 50 matches the compliance of microbumps 32.

FIG. 10 illustrates a portion of a device with an edge seal 50c that can deform in more than one direction. Edge seal 50c is a continuous, non-linear bump seal that surrounds microbumps 32. Only a portion of seal 50c is shown, and microbumps 32 are omitted for clarity. Edge seal 50c has a wavy shape. When pressure 52 is applied to bump seal 50c, such as while bonding device 5 to a mount (not shown in FIG. 10), bump seal 50c can deform in more than one direction, indicated by arrows 55 and 56. FIG. 11 illustrates the edge seal of FIG. 10 after undergoing plastic deformation during bonding. Edge seal 50d has spread out in the directions 55 and 56 indicated in FIG. 10.

FIG. 12 illustrates a portion of a device with another example of an edge seal 50e that can deform in more than one direction. Edge seal 50e is two lines 50f and 50g of offset microbumps that surround microbumps 32. Only a portion of edge seal 50e is shown, and microbumps 32 are omitted for clarity. Microbumps in lines 50f and 50g need not be in contact with each other, though they may be. When pressure 52 is applied to bump seal 50e, such as while bonding device 5 to a mount (not shown in FIG. 12), bump seal 50e can deform in more than one direction, indicated by arrows 55 and 56. FIG. 13 illustrates the edge seal of FIG. 12 after undergoing plastic deformation during bonding. The two lines 50f and 50g of microbumps in edge seal 50e have spread out in the directions 55 and 56 indicated in FIG. 12 to form a continuous seal 50h.

During ultrasonic bonding, described above, the transducer generally vibrates in a single direction. For example, the transducer may vibrate along axis 56, illustrated in FIGS. 10 and 12, and create little or no motion along axis 55. Compliant bonding structures tend to preferentially collapse along the vibration axis. Accordingly, in some embodiments, edge seal 50 is wider along axes perpendicular to the vibration axis, and narrower along axes parallel to the vibration axis.

FIGS. 14-19 illustrate examples of LEDs and mounts. The LEDs described below may be attached to the mounts by microbumps between the mount and one or both of n- and p-contacts. The LEDs described below have one large area contact and one small area contact. In some embodiments, the large area contact, often the p-contact, may be connected to the mount by conventional gold-gold interconnects or stud bumps, and the small area contact, often the n-contact, may be connected to the mount by microbumps, as described above. In contrast to the microbumps described above, conventional gold-gold interconnects are generally at least 25 microns wide and spaced on the order of 100 microns apart.

Figure 14:
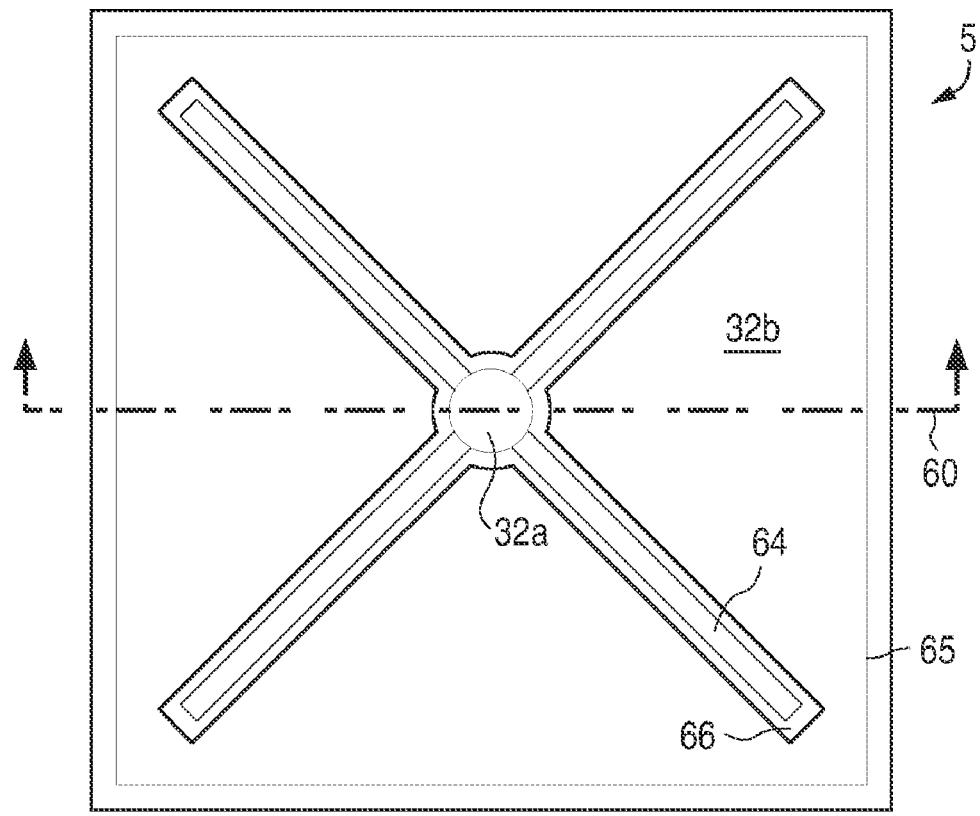
FIG. 14 is a plan view of an LED device including a compliant bonding structure according to embodiments of the invention.
Figure 15:
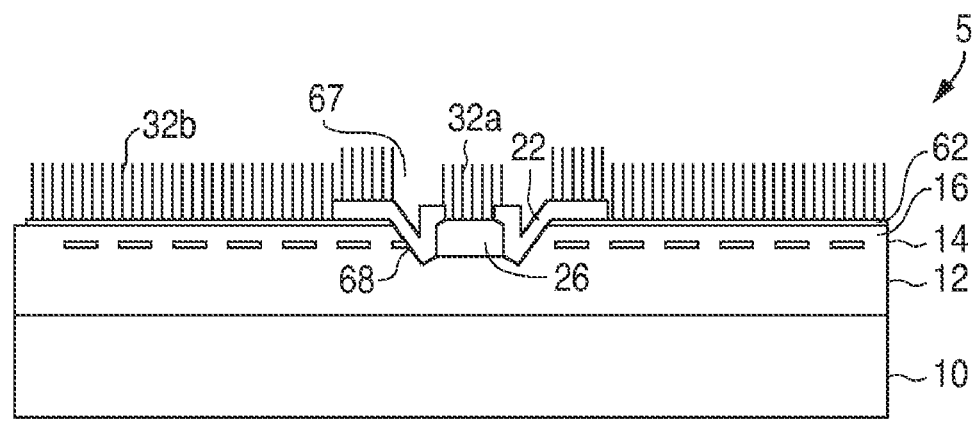
FIG. 15 is a cross section of the device illustrated in FIG. 14.

FIG. 14 is a plan view of an LED die 5. FIG. 15 is a cross sectional view of the device illustrated in FIG. 14, taken along axis 60. P-contact 62 may be, for example, a reflective layer, such as silver or a combination of silver and indium tin oxide, formed in direct contact with p-type region 16. An evaporable, etchable barrier such as nickel, nickel vanadium, or palladium may be formed over the reflective layer. After depositing the p-contact metals 62, trench 68 is patterned, then etched.

An n-contact 26 is formed in trench 68. N-contact 26 includes one or more relatively narrow arms 64. In the device shown in FIG. 14, the four arms in the n-contact are formed in an X-shape; however, the number and particular arrangement of the arms may differ. In some embodiments, n-contact arms 64 extend to the edge of LED die 5, and/or may be formed on the periphery of LED die 5, surrounding the p-contact, if more n-contact area is required. The n-contact arms 64 may be tens of microns wide; for example, between 15 and 25 microns wide. The n-contact arms 64 are formed in a trench 66 between, for example, 25 and 35 microns wide. The center section of the n-contact, shown by microbump area 32b in FIG. 14, may be, for example, between 35 and 45 microns wide. The height of the n-contact may be selected to be within a half micron of co-planar with the top of p-type region 16, a height of a few microns in some embodiments. In some embodiments, when viewed as illustrated in FIG. 14, the top of the n-contact is below the top of the p-contact.

After the n-contact 26 is formed, a dielectric layer 22, such as $SiN_x$ formed by plasma-enhanced chemical vapor deposition or $AlO_x$ formed by electron beam evaporation, is deposited to electrically isolate the n- and p-contacts. In some embodiments, a lower index of refraction dielectric layer may be used to reduce the amount of light leaking through dielectric layer 22. The dielectric layer is then etched back to expose the p- and n-contacts, except for a 5 micron thick band 22a on the edges of the contacts, which is left to compensate for manufacturing tolerances. In conventional devices with small n-contact areas such as n-contact arms, the n- and p-contacts are typically redistributed to large-area contacts by a metal-dielectric layer stack. Any breach in the dielectric layer or layers in the stack can cause shorting, which may lead to device failure. In addition, forming the metal-dielectric layer stack requires additional lithographic steps. The use of microbumps, as described below, may eliminate the requirement of redistributing the contacts to large-area contacts. Dielectric layer 22 may be thin, for example no thicker than 0.5 microns in some embodiments, no thicker than 0.4 microns in some embodiments. The use of microbumps, as described below, may also eliminate the need to use underfill to support the die during substrate removal, though underfill may be used in some embodiments, for example to supplement the support provided by the microbumps and other interconnects, or to provide a seal to prevent humidity or other contaminants from inhabiting the space between the LED and the mount.

Microbumps 32 are then formed on n- and p-contacts 26 and 62. Microbumps 32b are formed on the p-contact 62, and microbumps 32a are formed on n-contact 26. Microbumps 32a are limited to the center section of the n-contact 26; no microbumps are formed on n-contact arms 64. The center section of the n-contact on which the microbumps are formed need not be in the center of the device, as shown in FIG. 14. N-contact arms 64 do not contact mount 40, since they are recessed relative to the height of microbumps 32a and 32b. The compliance of microbumps 32 compensates for any variation in height between dielectric layer 22a, the top of n-contact 26, and the top of p-contact 62.

In some embodiments, to prevent damage to the semiconductor layers during removal of the growth substrate, the gaps between regions with microbumps are limited to less than 40 microns. For example, the trenches 66 in which n-contact arms 64 are formed are limited to less than 40 microns, and the gap 67 between microbump regions 32a and 32b shown in FIG. 15 is limited to less than 40 microns in some embodiments, and less than 20 microns in some embodiments. In some embodiments, electrically isolated microbumps may be formed in the areas between the n- and p-contact microbumps 32a and 32b. Such microbumps support the device during substrate removal, but are electrically isolated, for example by a dielectric layer.

Figure 16:
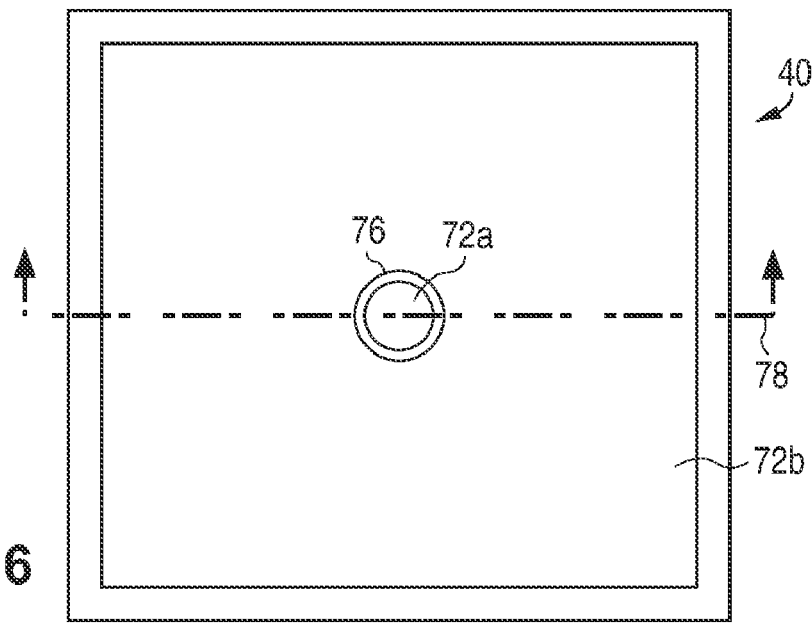
FIG. 16 is a plan view of a mount on which the device illustrated in FIG. 14 may be mounted.
Figure 17:
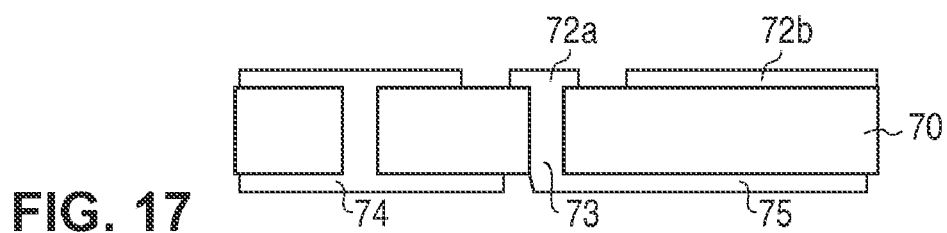
FIG. 17 is a cross section of the mount illustrated in FIG. 16.

FIG. 16 is a plan view of a mount 40 on which the device shown in FIGS. 14 and 15 may be mounted. FIG. 17 is a cross sectional view of the mount of FIG. 16 taken along axis 78. Mount 40 includes a body 70, which may be an insulating material such as ceramic, or a semiconducting material such as silicon. N-bond pad 72a aligns with the microbumps 32a electrically connected to the n-contact 26 on LED die 5, as illustrated in FIG. 15. P-bond pad 72b aligns with the microbumps 32b electrically connected to the p-contact 62 on LED die 5. The gap 76 between n-bond pad 72a and p-bond pad 72b may be, for example, at least 15 microns wide. Microbumps formed on mount 40 which align with microbumps 32 formed on the LED die 5 may be formed on the n- and p-bond pads 72a and 72b on mount 40. These microbumps are not shown in FIGS. 16 and 17. If aligning microbumps are formed on mount 40, obviously no aligning microbumps are formed on the mount areas corresponding to n-contact arms 64. Vias 73 connect the n- and p-bond pads 72a and 72b on the top side of body 70 to bottom side n- and p-bond pads 75 and 74.

Figure 18:
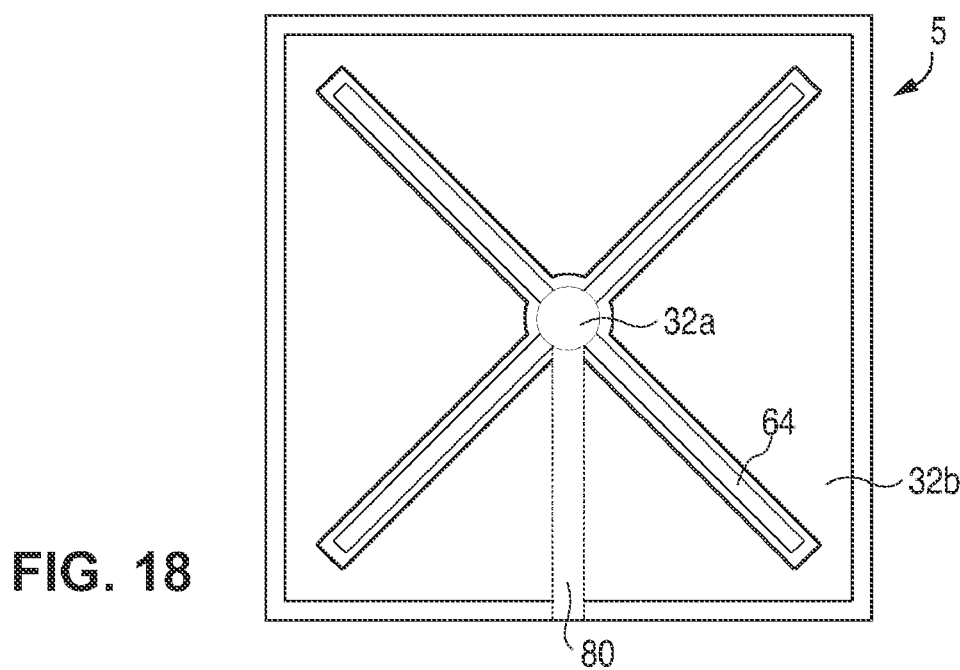
FIG. 18 is a plan view of an LED device including a compliant bonding structure according to embodiments of the invention.
Figure 19:
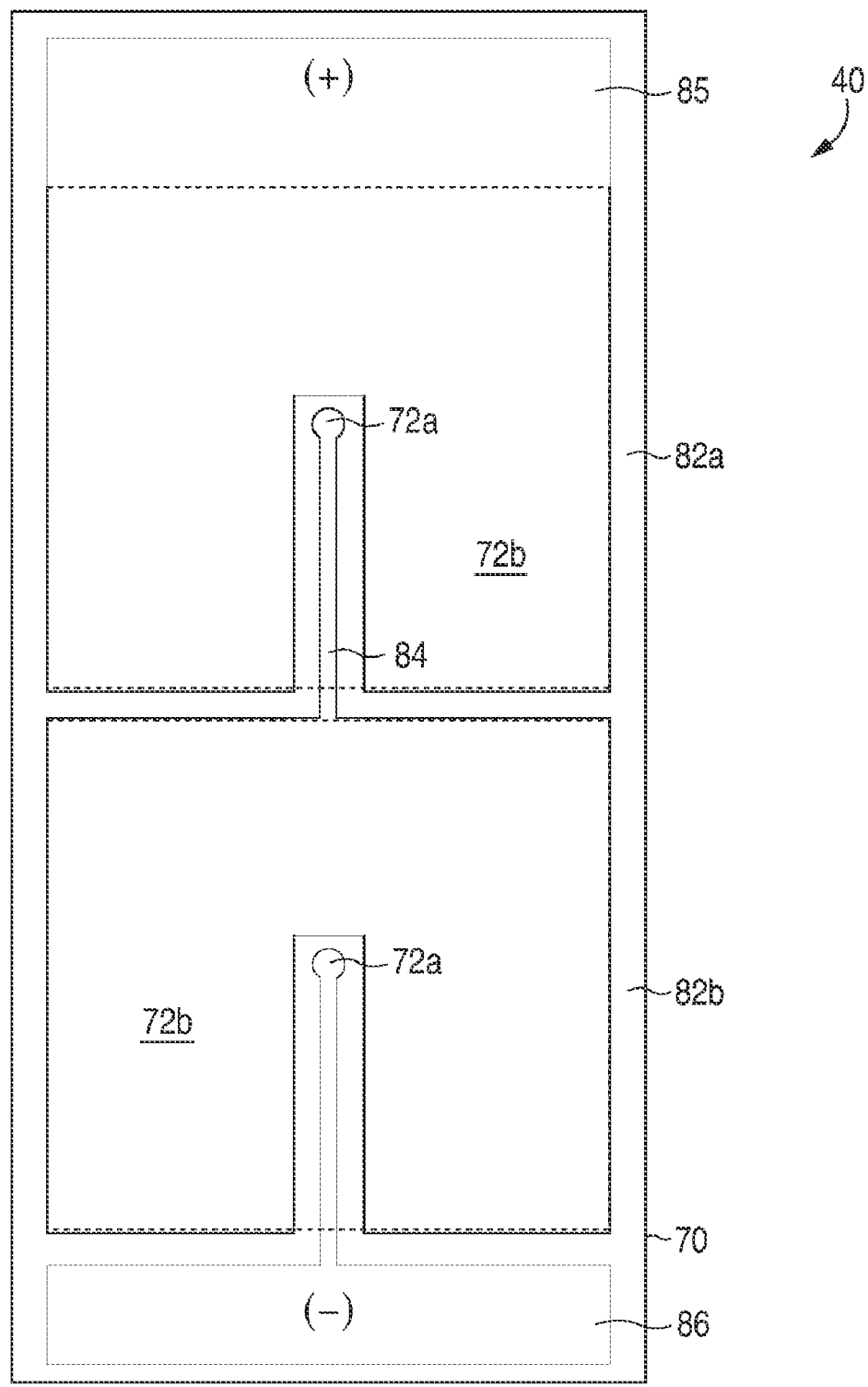
FIG. 19 is a plan view of a mount on which two of the devices illustrated in FIG. 18 may be mounted.

FIG. 18 is a plan view of an LED die 5. FIG. 19 is a plan view of a mount on which two LED dice may be mounted in series. Like the device illustrated in FIG. 14, in the device illustrated in FIG. 18, the n-contact includes a center area on which microbumps 32a are formed, and arms 64, on which no microbumps are formed. On the p-contact, microbumps 32b are omitted from a gap 80, which may be, for example, between 25 and 40 microns wide.

Two LED dice may be mounted on the mount illustrated in FIG. 19, in areas 82a and 82b. The two devices are connected in series. A metal trace 84 connects the n-contact region 72a on device 82a to the p-contact region 72b on device 82b. The devices on mount 40 may be electrically connected to other structures (such as a circuit board) by n- and p-contact pads 86 and 85. Gap 80 in microbumps 32b on the LED die shown in FIG. 18 is aligned with metal trace 84. Trace 84 may be recessed relative to the height of the microbumps 32b surrounding gap 80, such that trace 84 does not contact the p-contact on the die mounted over it.

Though the above-described examples and embodiments refer to flip clip III-nitride light emitting devices, the compliant bonding structures and edge seals described herein may be used with any suitable device, which need not be a flip chip, a III-nitride device, an LED, or even a light emitting device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A structure comprising:
   a light emitting device comprising:
      a semiconductor structure comprising a light emitting layer disposed between an n-type region and a p-type region;
      a metal p-contact disposed on the p-type region; and
      a metal n-contact disposed on the n-type region;
      wherein the metal p-contact and the metal n-contact are both formed on a same side of the semiconductor structure;
   a mount; and
   a bonding structure disposed between the light emitting device and the mount, the bonding structure comprising:
      a plurality of metal regions separated by gaps; and
      a metal structure disposed between the light emitting device and the mount proximate to an edge of the light emitting device, wherein the metal structure is configured such that during bonding, the metal structure forms a continuous seal between the light emitting device and the mount.

2. The structure of claim 1 wherein the metal regions comprise gold bumps compressed by bonding the light emitting device to the mount.

3. The structure of claim 1 wherein the metal regions comprise a metal with a Young's modulus less than 150 GPa.

4. The structure of claim 1 wherein a portion of the bonding structure underlying the metal n-contact is separated from a portion of the bonding structure underlying the metal p-contact by less than 40 microns.

5. The structure of claim 1 wherein the metal n-contact comprises a center portion and an arm portion, wherein the arm portion extends from the center portion toward an edge of the light emitting device, wherein a portion of the bonding structure underlies the center portion and no portion of the bonding structure underlies the arm portion.

6. The structure of claim 5 further comprising a gap disposed between the mount and the arm portion.

7. The structure of claim 5 wherein the metal n-contact is formed in a trench formed in the semiconductor structure, wherein a top surface of the metal n-contact is recessed relative to a top surface of the metal p-contact.

8. The structure of claim 7 further comprising a dielectric layer disposed between a portion of the metal p-contact and a portion of the metal n-contact, wherein a portion of a top surface of the dielectric layer extends above the top surfaces of the metal n-contact and the metal p-contact.

9. The structure of claim 8 further comprising a portion of the bonding structure disposed between the mount and the portion of the top surface of the dielectric layer extending above the top surfaces of the metal n-contact and the metal p-contact.

10. The structure of claim 1 wherein no bonding structure is formed in an area underlying the metal p-contact, wherein the area with no bonding structure is aligned with a metal trace formed on the mount.

11. The structure of claim 1 wherein the metal structure comprises a continuous, linear metal bump disposed between the light emitting device and the mount proximate to an edge of the light emitting device, wherein the continuous, linear metal bump forms a seal between the light emitting device and the mount.

12. The structure of claim 1 wherein the metal structure comprises a continuous, curved metal bump disposed between the light emitting device and the mount proximate to an edge of the light emitting device, wherein the continuous, curved metal bump forms a seal between the light emitting device and the mount.

13. The structure of claim 1 wherein the metal structure comprises at least two lines of offset metal bumps disposed between the light emitting device and the mount proximate to an edge of the light emitting device, wherein the at least two lines of metal bumps collapse during bonding to form a continuous seal between the light emitting device and the mount.

14. A method of bonding a light emitting device to a mount, the light emitting device comprising a semiconductor structure comprising a light emitting layer disposed between an n-type region and a p-type region, a metal p-contact disposed on the p-type region, and a metal n-contact disposed on the n-type region, wherein the metal p-contact and the metal n-contact are both formed on a same side of the semiconductor structure, the method comprising:
    positioning a bonding structure between the light emitting device and the mount, the bonding structure comprising:
        a first metal structure disposed between the mount and one of the metal p-contact and the metal p-contact; and
        a second metal structure disposed between the light emitting device and the mount proximate to an edge of the light emitting device; and
    causing the first and second metal structures to collapse; wherein the second metal structure forms a continuous seal between the light emitting device and the mount.

15. The method of claim 14 wherein the first metal structure comprises a plurality of metal regions separated by gaps.

16. The method of claim 14 wherein the first metal structure comprises a porous metal.

17. The method of claim 14 wherein the second metal structure comprises a continuous, linear metal bump.

18. The method of claim 14 wherein the second metal structure comprises a continuous, curved metal bump.

19. The method of claim 14 wherein the second metal structure comprises at least two lines of offset metal bumps.

* * * * *